(12) United States Patent
Koriyama et al.

(10) Patent No.: US 6,188,368 B1
(45) Date of Patent: Feb. 13, 2001

(54) SLOT ANTENNA

(76) Inventors: Shinichi Koriyama; Kenji Kitazawa; Hidehiro Minamiue, all of c/o Kyocera Corporation, 1-4, Yamashita-cho, Kokubu, Kagoshima-ken (JP)

(*) Notice: Under 35 U.S.C. 154(b), the term of this patent shall be extended for 0 days.

(21) Appl. No.: 09/258,830

(22) Filed: Feb. 26, 1999

(51) Int. Cl.$^7$ .................................................. H01Q 13/00
(52) U.S. Cl. ............................ 343/767; 343/770; 343/872
(58) Field of Search ...................................... 343/767, 770, 343/769, 700 MS, 872; 333/24 C

(56) References Cited

U.S. PATENT DOCUMENTS

| | | | |
|---|---|---|---|
| 4,130,822 | * 12/1978 | Conroy | 343/767 |
| 4,197,545 | * 4/1980 | Favaloro et al. | 343/700 MS |
| 4,431,996 | * 2/1984 | Milligan | 343/708 |
| 5,392,152 | * 2/1995 | Higgins et al. | 359/333 |
| 5,489,913 | * 2/1996 | Raguenet et al. | 343/767 |
| 5,631,659 | * 5/1997 | Evans et al. | 343/700 MS |

* cited by examiner

Primary Examiner—Tan Ho

(57) ABSTRACT

A slot antenna comprising a dielectric substrate, a high-frequency signal transmission line formed on one surface of said dielectric substrate and having an open end, and a ground layer formed on the other surface of said dielectric substrate, said ground layer having a slot at a position opposed to the open end of said transmission line, wherein a dielectric plate for impedance matching is laminated on the surface of said ground layer on the side where said slot is formed so as to cover said slot. The slot antenna not only features a high antenna efficiency but also can be easily and cheaply produced by a layer-laminating method which is a generally employed technology for producing multi-layer wiring substrates. Besides, the slot antenna has a very simple structure which is small in size and is light in weight, and can be very well adapted to the systems that require these characteristics.

6 Claims, 2 Drawing Sheets

SLOT ANTENNA

BACKGROUND OF THE INVENTION

1. Field of the Invention

The present invention relates to a slot antenna adapted to transmitting or receiving high-frequency signals of chiefly microwaves or millimeter waves.

2. Description of the Prior Art

In recent years, data have been transmitted in a wireless manner and on a personal basis as represented by portable telephones. Under such circumstances, it has been desired to transmit large amounts of data at higher speeds. For this purpose, semiconductor elements (high-frequency semiconductor elements) have been developed that operate in high-frequency regions such as of millimeter waves (30 to 300 GHz).

There have further been proposed various applied systems using high-frequency semiconductor elements that work on millimeter electromagnetic waves, as represented by a between-the-car radar and a wireless LAN. For example, in the Electronics Society, Japanese Academy of Electronic Data Communication, 1995, a between-the-car radar (see SC-7-6), a cordless camera system (see C-137), a high-speed wireless LAN (see C-139) and the like systems have been proposed.

These systems all utilize radio waves, and signals are exchanged through antennas between the system and space in which radio waves propagate. A variety kinds antennas have heretofore been studied for dealing with high-frequency signals as can be represented by a microstrip antenna, a horn antenna, a slot antenna and the like antennas.

The slot antenna has a structure in which a high-frequency signal transmission line such as a microstrip line is formed on one surface of a dielectric substrate, a ground layer is formed on the other surface thereof, a slot is formed in the ground layer at a position opposed to an open end of the transmission line, and the transmission line and the slot are electromagnetically coupled together. The slot antenna having such a structure is advantageous in that it can be easily produced by utilizing a general layer-laminating technology, it is particularly cheaply produced among the above-mentioned various kinds of antennas, and it is very suited for the systems that must be constructed in small sizes and in light weights.

However, the existing slot antennas have a defect of low efficiency (signal transmission characteristics) and, hence, it has been demanded to improve the efficiency.

SUMMARY OF THE INVENTION

It is therefore an object of the present invention to provide a slot antenna capable of transmitting high-frequency signals maintaining a high efficiency.

According to the present invention, there is provided a slot antenna comprising a dielectric substrate, a high-frequency signal transmission line formed on one surface of said dielectric substrate and having an open end, and a ground layer formed on the other surface of said dielectric substrate, said ground layer having a slot at a position opposed to the open end of said transmission line, wherein a dielectric plate for impedance matching is laminated on the surface of said ground layer on the side where said slot is formed so as to cover said slot.

In the conventional slot antenna, it is considered that there exists a mismatching between the impedance of the slot portion and the impedance of external space in which the electromagnetic waves propagate, high-frequency signals are reflected by the slot portion due to the mismatching and, as a result, the efficiency of the antenna remains low. According to the present invention, on the other hand, the dielectric plate for impedance matching is provided so as to cover the slot, whereby mismatching of the impedance is suppressed, high-frequency signals are not reflected by the slot portion, and a high antenna efficiency is accomplished.

DETAILED DESCRIPTION OF THE INVENTION

Figure 1:
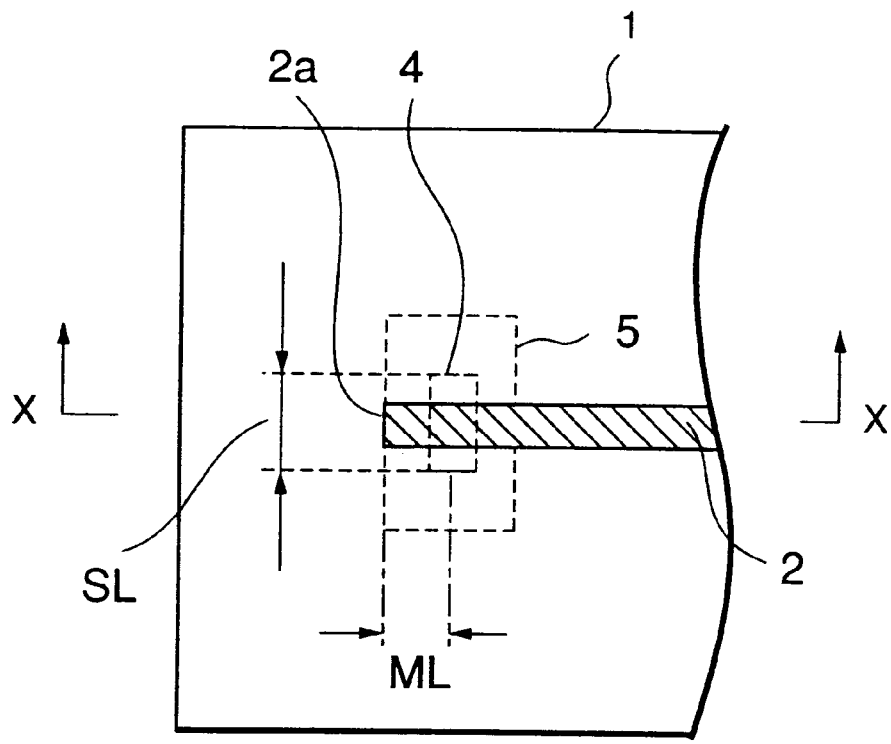
FIG. 1 is a plan view illustrating a slot antenna according to the present invention.
Figure 2:
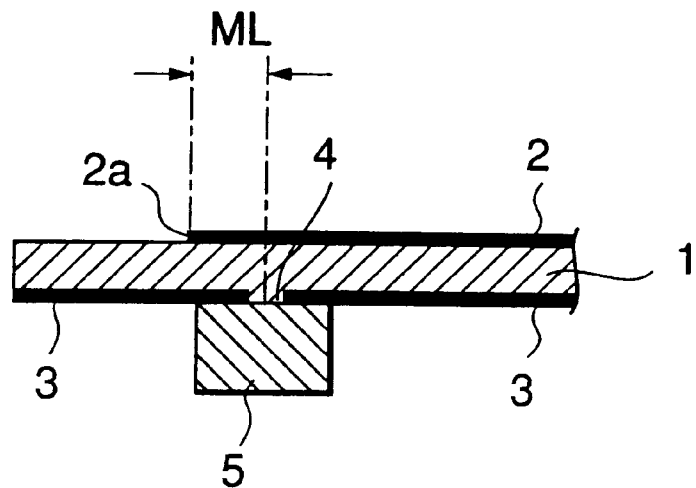
FIG. 2 is a side sectional view (X—X sectional view) of the slot antenna of FIG. 1.

Referring to FIGS. 1 and 2, the slot antenna of the present invention is provided with a dielectric substrate 1 which has, on one surface thereof, a high-frequency signal transmission line 2 with an open end 2a, and has, on the other surface thereof, a ground layer 3. The ground layer 3 has a slot 4 formed at a position opposed to the open end 2a.

A dielectric plate 5 for impedance matching is stuck with an adhesive or the like to the ground layer 3 so as to completely cover the slot 4.

In the thus constituted slot antenna, the high-frequency signals transmitted through the transmission line 2 are fed to the slot 4 owing to the electromagnetic coupling formed by a combination of the open end 2a and the slot 4. Here, the slot 4 has an impedance different from the impedance of external space. Due to mismatching of impedance, therefore, the high-frequency signals are reflected by the slot 4 despite it is attempted to directly radiate the electromagnetic waves from the slot 4 into the external space. According to the present invention, however, mismatching of impedance is relaxed since the slot is covered with the dielectric plate 5 for impedance matching. Therefore, the electromagnetic waves are highly efficiently radiated into the external space and the antenna efficiency is enhanced.

According to the present invention, it is desired that the dielectric plate 5 for impedance matching has a thickness h (mm) that satisfies the condition represented by the following formula (1):

$$53.7/(f \cdot \epsilon_1^{1/2}) \leq h \leq 89.4/(f \cdot \epsilon_1^{1/2}) \quad (1)$$

where $\epsilon_1$ is a dielectric constant of the dielectric plate for impedance matching, and f is a frequency (GHz) of the transmitted signals.

When the dielectric plate 5 has a thickness h that lies outside the above-mentioned range, the action for relaxing the mismatching between the impedance of the slot 4 and the impedance of the external space decreases, and the signals tend to be reflected by the slot 4.

In order to enhance the electromagnetic coupling between the high-frequency signal transmission line 2 and the slot 4, furthermore, it is desired that the slot 4 has a size that satisfies the following conditions. That is, it is desired that the length ML (mm) from the open end 2a of the transmission line 2 to a portion corresponding to the center of the slot 4, and the length SL (mm) of the slot 4 in a direction at right angles with the direction in which the transmission line 2 extends, satisfy the conditions represented by the following formulas (2) and (3):

$$62.7/(f \cdot \in_2^{1/2}) \leq ML \leq 125/(f \cdot \in_2^{1/2}) \quad (2)$$

$$171/[f \cdot [(\in_1 + \in_2)/2]^{1/2}] \leq SL \leq 250/[f \cdot [(\in_1 + \in_2)/2]^{1/2}] \quad (3)$$

where $\in_1$ is a dielectric constant of the dielectric plate for impedance matching, $\in_2$ is a dielectric constant of the dielectric substrate, and f is a frequency (GHz) of the transmitted signals.

When the lengths ML and SL satisfy the above-mentioned formulas (2) and (3), the electromagnetic coupling between the transmission line 2 and the slot 4 becomes the greatest, and the signals are reflected least by the slot 4.

Though FIG. 1 shows the slot 4 of a rectangular shape, there is no particular limitation on the shape of the slot which, therefore, may be of an elliptical shape. It is desired that the conditions of the above-mentioned formulas (2) and (3) are satisfied even when the slot 4 is of an elliptical shape, as a matter of course.

In the present invention, there is no particular limitation on the size (width) of the dielectric plate 5 for impedance matching so far as the slot 4 is completely covered by the dielectric plate 5. For example, the dielectric plate 5 may have a size just for covering only the periphery of the slot 4 as shown in FIG. 2 or may have a size large enough for covering nearly the whole surface of the ground layer 3.

Figure 3:
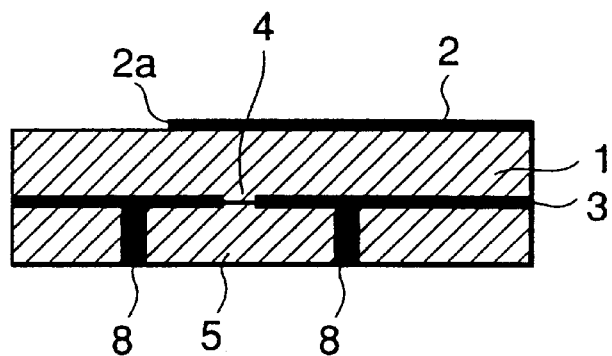
FIG. 3 is a side sectional view illustrating a slot antenna according to the most preferred embodiment of the present invention.

It is further desired that the dielectric plate 5 is provided with a conductor electrically connected to the ground layer 3 so as to surround the slot 4 that is covered by the dielectric plate 5. FIG. 3 illustrates a major portion of the slot antenna provided with such a conductor.

In FIG. 3, the ground layer 3 is covered by the dielectric plate 5 which includes therein a plurality of via conductors 8 which are electrically connected to the ground layer 3 so as to surround the slot 4. That is, in a state shown in FIG. 3, a portion of the dielectric plate 5 surrounded by the via conductors 8 produces a function for matching the impedance. The electromagnetic waves radiated from the slot 4 are radiated into the external space through the dielectric plate 5. Without such via conductors 8, the reflection of signals by the slot 4 can be suppressed to be not larger than, for example, -10 dB. However, the electromagnetic waves from the slot 4 are partly diffused in the dielectric plate 5 and propagate in the circumferential directions. By providing the via conductors 8 as shown in FIG. 3, the electromagnetic waves diffused in the dielectric plate 5 are shut off by the via conductors. Therefore, the electromagnetic waves from the slot 4 are all radiated into the external space to further enhance the antenna characteristics.

It is desired that the gap among the plurality of via conductors 8 is not larger than one-fourth the wavelength of the high-frequency signals that are transmitted from the standpoint of producing a sufficient degree of effect for shielding the electromagnetic waves. It is further possible to provide a plate-like continuous conductor instead of the plurality of via conductors 8. It is desired that the plurality of via conductors 8 are provided along the slot 4 so as to surround it. When the dielectric plate 5 has a small size as shown in FIG. 2, the via conductors 8 or the conductor plate may be provided to surround the dielectric plate 5.

In the slot antenna of the present invention shown in FIGS. 1 to 3, the dielectric substrate 1 and the dielectric plate 5 for impedance matching can be formed of a widely known substrate material such as an inorganic material, e.g., $Al_2O_3$, $Si_3N_4$, AlN or glass ceramics, an organic resin, e.g., bismaleimide resin or polyphenylene oxide, or an organic resin/inorganic filler composite material. These members may be made of the same dielectric material. When the dielectric substrate 1 and the dielectric plate 5 for impedance matching are formed of inorganic materials, the inorganic materials may be so selected as can be simultaneously fired, offering such an advantage that the slot antenna is produced at one time by the simultaneous firing.

The ground layer 3 and the via conductors 8 can be formed of a known conducting material such as W, Mo, Mo—Mn, Cu, Au or Ag. In order to decrease the transmission loss of high-frequency signals, it is desired to use a low-resistance conductor such as Cu, Au or Ag.

The above-mentioned slot antenna of the present invention not only features a high antenna efficiency but also can be easily and cheaply produced by a layer-laminating method which is a generally employed technology for producing multi-layer wiring substrates. Besides, the slot antenna has a very simple structure which is small in size and is light in weight, and can be very well adapted to the systems that require the above-mentioned characteristics. In particular, the dielectric substrate 1 permits a semiconductor element to be directly mounted thereon and can, hence, be easily fabricated together with a wiring board on which semiconductor elements are mounted.

Figure 4:
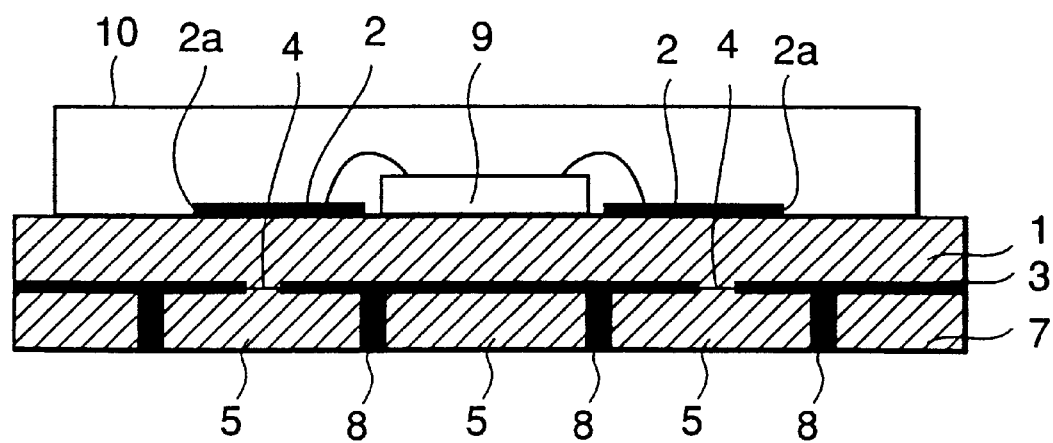
FIG. 4 is a side sectional view illustrating a wiring board equipped with the slot antenna of the present invention.

FIG. 4 illustrates the structure of a wiring board in which the slot antenna of the present invention is formed integrally together therewith.

In this wiring board, the high-frequency signal transmission line 2 is formed in the shape of a circuit pattern on one surface of the dielectric substrate 1, and the ground layer 3 having slot 4 is formed on the the surface of the dielectric substrate 1. That is, as described earlier, the slot 4 is formed at a position opposed to the open end 2a of the transmission line 2, and the transmission line 2 and the slot 4 are electromagnetically coupled together thereby to constitute a fundamental structure of the slot antenna.

Furthermore, a dielectric layer 7 is laminated on the ground layer 3, and a plurality of via conductors 8 electrically connected to the ground layer 3 are formed in the dielectric layer 7 so as to surround the slot 4. The dielectric layer 7 corresponds to the above-mentioned dielectric plate 5 for impedance matching. Here, however, what possesses the function for matching the impedance is only a portion surrounded by the via conductors 8. In FIG. 4, therefore, this portion is designated at 5.

A semiconductor element 9 such as silicon chip or the like is mounted on the surface of the dielectric substrate 1 on the side of the transmission line 2, and is connected to the high-frequency signal transmission line 2 by bonding wires. Furthermore, a cap 10 made of a conductor such as metal is adhered to the dielectric substrate 1. Owing to the cap 10, the semiconductor element 9 is air-tightly maintained.

In the wiring board having the above-mentioned structure, the slot antenna of the present invention is easily formed therein integrally together therewith relying upon the known multi-layer forming technology. It can therefore be understood that the wiring board is small in size, light in weight, and is cheaply produced. In the wiring board, it is allowable to form the dielectric substrate 1 in a multi-layer structure as a matter of course. For instance, the transmission line 2 that electromagnetically couples to the slot 4 may be formed on the inside, and the semiconductor element 9 may be mounted on the uppermost layer.

The invention will now be described by way of examples.

EXAMPLE 1

A linear conductor passage of a predetermined pattern was formed on one surface of a green sheet of alumina having a dielectric constant of 8.9 by metalizing tungsten, and a conductor layer having a slot was formed on the other surface of the green sheet by metalizing tungsten, followed by firing simultaneously in order to form a dielectric substrate 1, a high-frequency signal transmission line (microstrip line) 2 and a ground layer 3 having a slot 4 integrally together. Thereafter, gold was plated on the surfaces of the transmission line 2 and the ground layer 3 to prepare a slot antenna for comparison (sample No. 0).

In the slot antenna for comparison, the thickness of the dielectric substrate 1, the length ML from the open end 2a of the transmission line 2 to a portion corresponding to the center of the slot 4, and the length SL of the slot 4 in a direction at right angles with the direction in which the transmission line 2 extends, were as follows:

Thickness of the dielectric substrate: 0.2 mm

ML: 3.0 mm

SL: 6.6 mm

Next, a dielectric plate 5 for impedance matching (20 mm high, 10 mm wide and 2.4 mm thick) made of the same material as the dielectric substrate 1 was adhered on the surface of the slot 4 with an epoxy adhesive agent in order to prepare a slot antenna of the present invention (sample No. 1).

Furthermore, various slot antennas (samples Nos. 2 to 66) were prepared in the same manner as described above by changing the lengths ML, SL and thickness (h) of the dielectric plate 5.

In order to evaluate the transmission characteristics, a conversion line from the microstrip line into a grounded coplanar waveguide was provided at an end on the side opposite to the open end 2a of the transmission line 2 of each of the slot antennas produced as described above. A coplanar-type probe of a network analyzer was connected to the conductor-backed coplanar waveguide in order to measure the reflection characteristics of high-frequency signals of 10 GHz or 60 GHz. The results were as shown in Tables 1 and 2.

For some slot antennas, a conductor layer of Ag was adhered around the dielectric plate 5 to evaluate the transmission characteristics in the same manner as described above. The results were as shown in Tables 1 and 2.

Tables 1 and 2 show the ranges of h, ML and SL defined by the above-mentioned formulas (1) to (3) as F(h), F(ML) and F(SL).

It will be understood from the results of Tables 1 and 2 that when h, ML and SL satisfy the conditions of the formulas (1) to (3), the reflection becomes not larger than −10 dB, and highly efficient antennas are obtained. It will be further understood that the antenna efficiency is further improved by forming a conductor layer around the dielectric plate 5 for impedance matching.

TABLE 1

Frequency: 10 GHz

| Sample No. | ML (mm) | SL (mm) | h (mm) | S11 (dB) without conductor layer | S11 (dB) with conductor layer |
|---|---|---|---|---|---|
| 0 | 3.0 | 6.6 | not formed | −2 | — |
| *1 | 3.0 | 6.6 | 1.2 | −3 | −4 |
| 2 | 3.0 | 6.6 | 1.8 | −18 | −23 |
| 3 | 3.0 | 6.6 | 2.4 | −36 | −37 |
| 4 | 3.0 | 6.6 | 3.0 | −22 | −22 |
| *5 | 3.0 | 6.6 | 3.6 | −7 | −8 |

TABLE 1-continued

Frequency: 10 GHz

| Sample No. | ML (mm) | SL (mm) | h (mm) | S11 (dB) without conductor layer | S11 (dB) with conductor layer |
|---|---|---|---|---|---|
| *6 | 1.8 | 6.6 | 2.4 | −8 | — |
| 7 | 2.1 | 6.6 | 2.4 | −24 | — |
| 8 | 2.4 | 6.6 | 2.4 | −30 | — |
| 9 | 3.6 | 6.6 | 2.4 | −31 | — |
| 10 | 4.2 | 6.6 | 2.4 | −27 | — |
| *11 | 4.5 | 6.6 | 2.4 | −9 | — |
| *12 | 3.0 | 5.4 | 2.4 | −6 | — |
| 13 | 3.0 | 5.7 | 2.4 | −20 | — |
| 14 | 3.0 | 6.0 | 2.4 | −27 | — |
| 15 | 3.0 | 7.2 | 2.4 | −30 | — |
| 16 | 3.0 | 8.4 | 2.4 | −26 | — |
| *17 | 3.0 | 9.0 | 2.4 | −8 | — |
| *18 | 1.8 | 5.7 | 1.8 | −3 | — |
| 19 | 2.1 | 5.7 | 1.8 | −10 | — |
| 20 | 4.2 | 5.7 | 1.8 | −14 | — |
| *21 | 4.5 | 5.7 | 1.8 | −5 | — |
| *22 | 1.8 | 5.7 | 3.0 | −4 | — |
| 23 | 2.1 | 5.7 | 3.0 | −16 | — |
| 24 | 4.2 | 5.7 | 3.0 | −13 | — |
| *25 | 4.5 | 5.7 | 3.0 | −5 | — |
| *26 | 1.8 | 8.4 | 1.8 | −3 | — |
| 27 | 2.1 | 8.4 | 1.8 | −10 | — |
| 28 | 4.2 | 8.4 | 1.8 | −11 | — |
| *29 | 4.5 | 8.4 | 1.8 | −4 | — |
| *30 | 1.8 | 8.4 | 3.0 | −3 | — |
| 31 | 2.1 | 8.4 | 3.0 | −12 | — |
| 32 | 4.2 | 8.4 | 3.0 | −10 | — |
| *33 | 4.5 | 8.4 | 3.0 | −3 | — |

F(h) = 1.80–3.0 (mm)
F(ML) = 2.10–4.20 (mm)
F(SL) = 5.74–8.39 (mm)
Samples marked with * are those that do not satisfy the conditions of the formulas (1), (2) and (3) (the same holds in Tables 2 and 3, too).

TABLE 2

Frequency: 60 GHz

| Sample No. | ML (mm) | SL (mm) | h (mm) | S11 (dB) without conductor layer | S11 (dB) with conductor layer |
|---|---|---|---|---|---|
| *34 | 0.5 | 1.1 | 0.2 | −6 | −7 |
| 35 | 0.5 | 1.1 | 0.3 | −20 | −30 |
| 36 | 0.5 | 1.1 | 0.4 | −35 | −39 |
| 37 | 0.5 | 1.1 | 0.5 | −17 | −22 |
| *38 | 0.5 | 1.1 | 0.6 | −8 | −9 |
| *39 | 0.3 | 1.1 | 0.4 | −5 | — |
| 40 | 0.35 | 1.1 | 0.4 | −12 | — |
| 41 | 0.4 | 1.1 | 0.4 | −19 | — |
| 42 | 0.6 | 1.1 | 0.4 | −23 | — |
| 43 | 0.7 | 1.1 | 0.4 | −20 | — |
| *44 | 0.75 | 1.1 | 0.4 | −7 | — |
| *45 | 0.5 | 0.9 | 0.4 | −4 | — |
| 46 | 0.5 | 0.95 | 0.4 | −11 | — |
| 47 | 0.5 | 1.0 | 0.4 | −30 | — |
| 48 | 0.5 | 1.2 | 0.4 | −25 | — |
| 49 | 0.5 | 1.4 | 0.4 | −16 | — |
| *50 | 0.5 | 1.5 | 0.4 | −8 | — |
| *51 | 0.3 | 0.95 | 0.3 | −3 | — |
| 52 | 0.35 | 0.95 | 0.3 | −12 | — |
| 53 | 0.7 | 0.95 | 0.3 | −14 | — |
| *54 | 0.75 | 0.95 | 0.3 | −3 | — |
| *55 | 0.3 | 0.95 | 0.5 | −4 | — |
| 56 | 0.35 | 0.95 | 0.5 | −15 | — |
| 57 | 0.7 | 0.95 | 0.5 | −10 | — |

TABLE 2-continued

Frequency: 60 GHz

| Sample No. | ML (mm) | SL (mm) | h (mm) | S11 (dB) without conductor layer | S11 (dB) with conductor layer |
|---|---|---|---|---|---|
| *58 | 0.75 | 0.95 | 0.5 | −3 | — |
| *59 | 0.3 | 1.4 | 0.3 | −3 | — |
| 60 | 0.35 | 1.4 | 0.3 | −13 | — |
| 61 | 0.7 | 1.4 | 0.3 | −10 | — |
| *62 | 0.75 | 1.4 | 0.3 | −3 | — |
| *63 | 0.3 | 1.4 | 0.5 | −3 | — |
| 64 | 0.35 | 1.4 | 0.5 | −15 | — |
| 65 | 0.7 | 1.4 | 0.5 | −14 | — |
| *66 | 0.75 | 1.4 | 0.5 | −3 | — |

F(h) = 0.30–0.50 (mm)
F(ML) = 0.35–0.70 (mm)
F(SL) = 0.96–1.40 (mm)

EXAMPLE 2

A variety of slot antennas (samples Nos. 67 to 83) were prepared in the same manner as in Example 1 but using a glass ceramics having a dielectric constant of 5.6 as a dielectric material for constituting the dielectric plate 5 for impedance matching, and the reflection of high-frequency signals was measured at 60 GHz. For some slot antennas, a conductor layer of Ag was adhered around the dielectric plate 5 to evaluate the transmission characteristics in the same manner as described above. The results were as shown in Table 3.

It will be understood from the results of Table 3 that when h, ML and SL satisfy the conditions of the formulas (1) to (3), the reflection becomes not larger than −10 dB, and highly efficient antennas are obtained. It will be further understood that the antenna efficiency is further improved by forming a conductor layer around the dielectric plate 5 for impedance matching.

TABLE 3

Frequency: 60 GHz

| Sample No. | ML (mm) | SL (mm) | h (mm) | S11 (dB) without conductor layer | S11 (dB) with conductor layer |
|---|---|---|---|---|---|
| *67 | 0.5 | 1.3 | 0.3 | −7 | −8 |
| 68 | 0.5 | 1.3 | 0.4 | −14 | −20 |
| 69 | 0.5 | 1.3 | 0.5 | −32 | −34 |
| 70 | 0.5 | 1.3 | 0.6 | −23 | −24 |
| *71 | 0.5 | 1.3 | 0.7 | −8 | −9 |
| *72 | 0.3 | 1.3 | 0.5 | −6 | −8 |
| 73 | 0.35 | 1.3 | 0.5 | −16 | −20 |
| 74 | 0.4 | 1.3 | 0.5 | −28 | −31 |
| 75 | 0.6 | 1.3 | 0.5 | −30 | −35 |
| 76 | 0.7 | 1.3 | 0.5 | −18 | −19 |
| *77 | 0.75 | 1.3 | 0.5 | −9 | −9 |
| *78 | 0.5 | 1.0 | 0.5 | −3 | −4 |
| 79 | 0.5 | 1.1 | 0.5 | −10 | −12 |
| 80 | 0.5 | 1.2 | 0.5 | −19 | −25 |
| 81 | 0.5 | 1.4 | 0.5 | −22 | −31 |
| 82 | 0.5 | 1.5 | 0.5 | −17 | −20 |
| *83 | 0.5 | 1.6 | 0.5 | −6 | −8 |

F(h) = 0.38–0.63 (mm)
F(ML) = 0.35–0.70 (mm)
F(SL) = 1.06–1.55 (mm)

What is claimed is:

1. A slot antenna comprising a dielectric substrate, a high-frequency signal transmission line formed on one surface of said dielectric substrate and having an open end, and a ground layer formed on the other surface of said dielectric substrate, said ground layer having a slot at a position opposed to the open end of said transmission line, wherein
    a dielectric plate for impedance matching is laminated on the surface of said ground layer on the side where said slot is formed so as to cover said slot.
2. The slot antenna according to claim 1, wherein a conductor electrically connected to said ground layer is arranged around or inside said dielectric plate for impedance matching so as to surround said slot.
3. A wiring board equipped with the slot antenna of claim 1.
4. The wiring board according to claim 3, wherein a semiconductor element is mounted on the dielectric substrate.
5. A slot antenna comprising a dielectric substrate, a high-frequency signal transmission line formed on one surface of said dielectric substrate and having an open end, and a ground layer formed on the other surface of said dielectric substrate, said ground layer having a slot at a position opposed to the open end of said transmission line,
    wherein a dielectric plate for impedance matching is laminated on the surface of said ground layer on the side where said slot is formed so as to cover said slot, the plate having a thickness h (mm) that satisfies the condition represented by the following formula (1):

$$53.7/(f \cdot \in_1^{1/2}) \leq h \leq 89.4/(f \cdot \in_1^{1/2}) \quad (1)$$

where $\in_1$ is a dielectric constant of the dielectric plate for impedance matching, and f is a frequency (GHz) of the transmitted signals.

6. A slot antenna comprising a dielectric substrate, a high-frequency signal transmission line formed on one surface of said dielectric substrate and having an open end, and a ground layer formed on the other surface of said dielectric substrate, said ground layer having a slot at a position opposed to the open end of said transmission line, wherein
    a dielectric plate for impedance matching is laminated on the surface of said ground layer on the side where said slot is formed so as to cover said slot, and
    wherein the length ML (mm) from the open end of said transmission line to a portion corresponding to the center of said slot, and the length SL (mm) of said slot in a direction at right angles with the direction in which said transmission line extends, satisfy the conditions represented by the following formulas (2) and (3):

$$62.7/(f \cdot \in_2^{1/2}) \leq ML \leq 125/(f \cdot \in_2^{1/2}) \quad (2)$$

$$171/[(f \cdot [(\in_1 + \in_2)/2]^{1/2}] \leq SL \leq 250/(f \cdot [(\in_1 + \in_2)/2]^{1/2}] \quad (3)$$

where $\in_1$ is a dielectric constant of the dielectric plate for impedance matching, and $\in_2$ is a dielectric constant of the dielectric substrate, and f is a frequency (GHz) of the transmitted signals.

* * * * *